United States Patent
Liu et al.

(10) Patent No.: US 10,763,105 B2
(45) Date of Patent: Sep. 1, 2020

(54) METHOD FOR MANUFACTURING GROOVED MOSFET DEVICE BASED ON TWO-STEP MICROWAVE PLASMA OXIDATION

(71) Applicant: INSTITUTE OF MICROELECTRONICS, CHINESE ACADEMY OF SCIENCES, Beijing (CN)

(72) Inventors: Xinyu Liu, Beijing (CN); Yidan Tang, Beijing (CN); Shengkai Wang, Beijing (CN); Yun Bai, Beijing (CN); Chengyue Yang, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 28 days.

(21) Appl. No.: 16/234,303

(22) Filed: Dec. 27, 2018

(65) Prior Publication Data
US 2019/0362966 A1    Nov. 28, 2019

(30) Foreign Application Priority Data
May 25, 2018 (CN) .......................... 2018 1 0521158

(51) Int. Cl.
*H01L 21/02* (2006.01)
*H01L 29/78* (2006.01)

(52) U.S. Cl.
CPC .. *H01L 21/02252* (2013.01); *H01L 21/02164* (2013.01); *H01L 21/02236* (2013.01); *H01L 29/7813* (2013.01)

(58) Field of Classification Search
CPC ......... H01L 21/02252; H01L 21/02236; H01L 21/02164; H01L 29/7813; H01L 29/66068; H01L 29/1608; H01L 21/049
(Continued)

(56) References Cited

U.S. PATENT DOCUMENTS 5,976,936 A  *  11/1999  Miyajima ........... H01L 29/7828
                                                              438/268
6,967,176 B1     11/2005  Hoff
(Continued)

FOREIGN PATENT DOCUMENTS

CN        101313393 A       11/2008
CN        101517716 A        8/2009
(Continued)

*Primary Examiner* — Caleen O Sullivan
(74) *Attorney, Agent, or Firm* — Christensen, Fonder, Dardi & Herbert PLLC

(57) ABSTRACT

A method of manufacturing a grooved-gate MOSFET device based on a two-step microwave plasma oxidation, including: etching a grooved gate, and oxidizing silicon carbide on a surface of the grooved gate to silicon dioxide by microwave plasma to form a grooved-gate oxide layer, the step of forming the grooved-gate oxide layer including: placing a silicon carbide substrate subjected to the grooved gate etching in a microwave plasma generating device; introducing a first oxygen-containing gas, heating generated oxygen plasma to a first temperature at a first heating rate, and performing low-temperature plasma oxidation at the first temperature and a first pressure; heating the oxygen plasma to a second temperature at a second heating rate, introducing a second oxygen-containing gas, and performing high-temperature plasma oxidation at the second temperature and a second pressure until a predetermined thickness of silicon dioxide is formed; stopping introduction of the oxygen-containing gas, and completing the reaction.

8 Claims, 3 Drawing Sheets

(58) Field of Classification Search
USPC .......................................................... 438/772
See application file for complete search history.

(56) References Cited

U.S. PATENT DOCUMENTS

| | | | |
|---|---|---|---|
| 2001/0053561 A1* | 12/2001 | Kitabatake | H01L 21/049 |
| | | | 438/99 |
| 2002/0119622 A1* | 8/2002 | Steigerwald | H01L 28/40 |
| | | | 438/244 |
| 2005/0215066 A1 | 9/2005 | Joshi et al. | |
| 2006/0003603 A1 | 1/2006 | Fukuchi | |
| 2006/0199312 A1* | 9/2006 | Harris | H01L 29/1066 |
| | | | 438/133 |
| 2009/0047778 A1 | 2/2009 | Sasaki | |
| 2010/0093185 A1 | 4/2010 | Kabe et al. | |

FOREIGN PATENT DOCUMENTS

| | | |
|---|---|---|
| CN | 102142369 A | 8/2011 |
| CN | 105280503 A | 1/2016 |
| CN | 106611700 A | 5/2017 |

\* cited by examiner

METHOD FOR MANUFACTURING GROOVED MOSFET DEVICE BASED ON TWO-STEP MICROWAVE PLASMA OXIDATION

CROSS-REFERENCE TO RELATED APPLICATION(S)

This application claims priority to a Chinese Patent Application No. 201810521158.1, filed with the Chinese Patent Office on May 25, 2018 and entitled "METHOD FOR MANUFACTURING GROOVED MOSFET DEVICE BASED ON TWO-STEP MICROWAVE PLASMA OXIDATION", which is incorporated herein by reference entirely.

TECHNICAL FIELD

The present disclosure relates to the technical field of semiconductors, and in particular relates to a manufacturing method of a grooved gate MOSFET device based on a two-step microwave plasma oxidation.

BACKGROUND

Silicon carbide (SiC) is a third-generation semiconductor—wide band gap semiconductor material, with advantages of wide band gap, high critical breakdown field strength, and high thermal conductivity. It is an ideal material for high-voltage, high-power semiconductor devices. SiC power electronic devices are at the heart of next-generation high-efficiency power electronics technology. Compared to Si MOSFETs, SiC MOSFETs have lower on-resistance, higher switching voltage, higher application frequency, and better temperature performance, making them ideal for power switching applications. The integrated manufacturing process of SiC MOSFET devices, especially the gate dielectric process, is a hot topic of current research.

SiC is the only compound semiconductor from which $SiO_2$ can be thermally grown, which allows SiC to realize the device structure of all Si MOS devices. The thermal oxidation of SiC requires a higher oxidation temperature than Si, and the oxidation temperature is as high as 1300° C. At present, the mainstream SiC oxidation process mainly uses an electric resistance heating furnace. The main principle is based on the reaction of silicon carbide with oxygen molecules, but this method of oxidation with oxygen molecules easily causes defects such as residual carbon clusters, Si—O—C bonds, C dangling bonds, and oxygen vacancies at the interface, and the interface quality is degraded, resulting in a decrease in mobility, as shown in FIG. 1. Especially at such high temperatures, in addition to interface oxidation, it also causes interface damage and reduces oxidation efficiency.

In recent years, researchers have proposed a method of oxidizing SiC by plasma at low temperatures, which improves the interface quality to some extent. However, the oxidation efficiency of the method is low. Especially in the case where a thick $SiO_2$ layer is required, the oxidation time is long, and at the interface between SiC and $SiO_2$, SiC and $SiO_2$ are still in a thermodynamic equilibrium state, resulting in unsatisfactory interface quality.

In addition, experiments have shown that the oxidation rate of silicon carbide in different crystal orientations varies widely. On the Si plane, the plane perpendicular to the a-axis has an oxidation rate even 3-5 times that of the plane perpendicular to the c-axis. If the thermal oxidation process is used to form the gate oxide of the LIMOS structure, the thickness of the oxide layer on the sidewall is 3-5 times that of the bottom, as shown in FIG. 2, which prevents the device from turning on normally under forward bias.

This is because the channel is a longitudinal channel formed from the sidewall, and a higher gate voltage VG is required in order for the device to be normally turned on. However, since the thermal oxidation growth rate of $SiO_2$ on the sidewall is several times the rate of the bottom oxidation, the gate voltage of the channel region on the sidewall of the device does not reach the threshold voltage when the gate voltage reaches the maximum value of the safe operating voltage of the gate oxide, so the device cannot be turned on and the forward characteristic cannot be obtained. If the gate voltage is continuously increased, the stability of the bottom gate oxide is deteriorated, causing the bottom oxide layer to break down in advance and the device will not work properly. Therefore, forming a uniform gate oxide layer with a low interface state is the key to making a grooved gate MOSFET device.

SUMMARY

In order to solve the problems in the prior art, the present disclosure provides a manufacturing method of a grooved gate MOSFET device based on a two-step microwave plasma oxidation, which can form a uniform gate oxide layer with a low interface state.

In order to achieve the above object, the present disclosure adopts the following technical solutions.

A manufacturing method of a grooved gate MOSFET device based on a two-step microwave plasma oxidation comprises: etching a grooved gate, oxidizing silicon carbide on a surface of the grooved gate to silicon dioxide by microwave plasma to form a grooved gate oxide layer, the step of forming the grooved gate oxide layer comprising: placing a silicon carbide substrate subjected to the grooved gate etching in a microwave plasma generating device; introducing a first oxygen-containing gas, heating generated oxygen plasma to a first temperature at a first heating rate, and performing low-temperature plasma oxidation at the first temperature and a first pressure; heating the oxygen plasma to a second temperature at a second heating rate, introducing a second oxygen-containing gas, and performing high-temperature plasma oxidation at the second temperature and a second pressure until a predetermined thickness of silicon dioxide is formed; stopping introducing the oxygen-containing gas, and completing reaction; wherein, the first temperature is 300-400° C., the second temperature is 700-900° C., the first pressure is 100-200 mTorr, the second pressure is 700-900 mTorr, and the first heating rate is greater than the second heating rate.

Preferably, the first heating rate is 1-1.5° C./s, and the second heating rate is 0.5-1° C./s.

Preferably, the microwave plasma generating device has an input power of 800-2000 W and a microwave frequency of 2.4-2.5 GHz.

Preferably, plasma discharge time of the low-temperature plasma oxidation is 400-600 s, and plasma discharge time of the high-temperature plasma oxidation is 600-1000 s.

Preferably, the first oxygen-containing gas is a mixture of oxygen and hydrogen or an inert gas, wherein oxygen content is 30-99 vol. %, and the second oxygen-containing gas is pure oxygen.

Preferably, the formed silicon dioxide has a thickness of 1-60 nm.

Preferably, the method further comprises a step of discharging generated carbon monoxide.

Preferably, after the completion of the reaction, nitrogen gas is introduced, and temperature is lowered in a nitrogen atmosphere.

Compared with the prior art, the present disclosure has the following beneficial effects.

The present disclosure can significantly improve the oxidation efficiency of silicon carbide, form a low damage surface, improve surface roughness, reduce carbon residue at the interface, reduce dangling bonds at the interface, and reduce electron defects in silicon oxide, thereby improving effective mobility, especially effective mobility in high electric fields.

The present disclosure can form a uniform gate dielectric layer, so that the thickness of the oxide layer on the sidewall is equivalent to the thickness of the bottom oxide layer. Under a certain gate voltage, the device can be normally turned on, and the normal forward characteristic is obtained, thereby preventing the breakdown of the bottom gate oxide layer in advance and taking advantage of the grooved gate MOSFET device.

DETAILED DESCRIPTION

To make the objectives, technical solutions, and advantages of the present disclosure clearer, the present disclosure will be further described in detail below in conjunction with the specific embodiments and with reference to the accompanying drawings.

The inventors have found through a large number of experimental studies that the process of oxidizing silicon carbide to form silicon oxide may be regarded as the reaction diffusion process of carbon. Under the condition of low-temperature plasma oxidation, due to the long duration of the reaction process, the reaction diffusion process of carbon is equivalent to the chemical reaction process of plasma. In this case, there is still a gradient distribution of carbon in a certain range at the SiC/$SiO_2$ interface. Although researchers have tried to perform plasma oxidation of silicon carbide at high temperatures, the plasma oxidation reaction conditions are difficult to control after the temperature rise, so the SiC/$SiO_2$ interface quality is not significantly improved.

To this end, the present disclosure proposes a new microwave plasma-based silicon carbide oxidation method. By optimizing the conditions of plasma oxidation, better oxidation efficiency is obtained, and the interface quality is remarkably improved.

The present disclosure mainly employs a two-step method. By changing the temperature, gas composition and pressure during the first oxidation and the second oxidation, the molecular oxygen is ionized within a certain range of plasma oxidation conditions to form an oxygen plasma or an oxygen radical formed by homologization. Under the oxidizing conditions of the present disclosure, oxygen plasma or oxygen radicals have significant chemical activity, as well as smaller sizes, than oxygen molecules. In the occurrence of interface oxidation, while obtaining the oxide layer, due to the smaller size, the oxygen plasma or oxygen radicals do not need to interact more with the crystal lattice during the diffusion process to oxidize the residual carbon produced by the reaction at the interface, forming a volatile carbon monoxide which is desorbed during the reaction.

Figure 1:
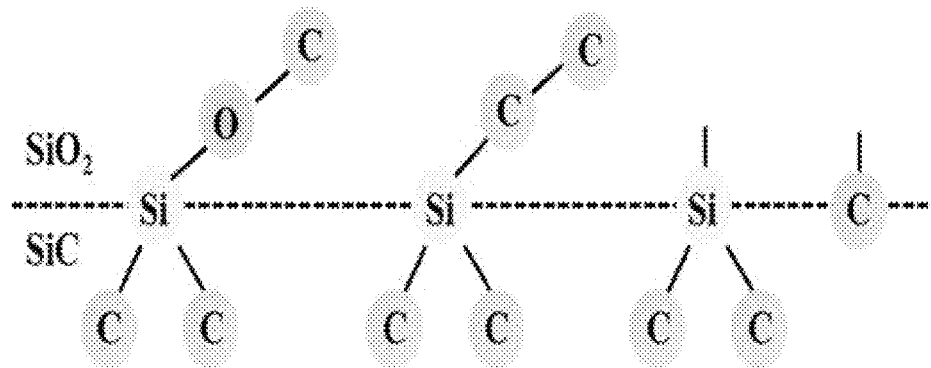
FIG. 1 is a schematic view of SiC/$SiO_2$ interface defects.
Figure 2:
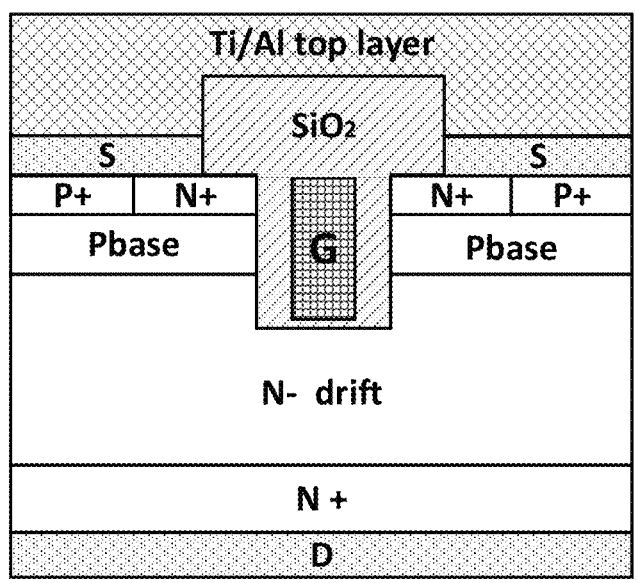
FIG. 2 is a schematic structural view of a grooved gate MOSFET device formed by a conventional thermal oxidation process.
Figure 3:
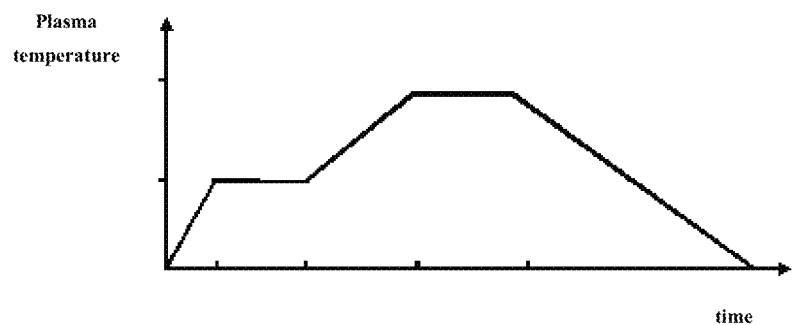
FIG. 3 is a reaction process of oxidation of silicon carbide according to an embodiment of the present disclosure.

As shown in FIG. 3, based on the above research, the microwave plasma-based silicon carbide oxidation method proposed by the present disclosure comprises:

providing a silicon carbide substrate;

placing the silicon carbide substrate in a microwave plasma generating device;

introducing a first oxygen-containing gas, heating generated oxygen plasma to a first temperature at a first heating rate, and performing low-temperature plasma oxidation at the first temperature and a first pressure;

heating the oxygen plasma to a second temperature at a second heating rate, introducing a second oxygen-containing gas, and performing high-temperature plasma oxidation at the second temperature and a second pressure until a predetermined thickness of silicon dioxide is formed;

stopping introducing the oxygen-containing gas, and completing reaction.

Microwave plasma oxidation of SiC includes the following processes: oxygen radicals or oxygen ions are transported to the surface of the oxide layer; oxygen radicals or oxygen ions diffuse through the oxide layer to the reaction interface; silicon carbide reacts with oxygen radicals or oxygen ions at the interface; the gas generated by the reaction (CO) diffuses to the outside through the oxide layer; the gas generated by the reaction is discharged at the surface of the oxide layer.

In an embodiment of the present disclosure, the first temperature is 300-400° C., the second temperature is 700-900° C., the first pressure is 100-200 mTorr, the second pressure is 700-900 mTorr, the first heating rate is 1-1.5° C./s, and the second heating rate is 0.5-1° C./s.

In an embodiment of the present disclosure, the microwave plasma generating device has an input power of 800-2000 W and a microwave frequency of 2.4-2.5 GHz. Plasma discharge time of the low-temperature plasma oxidation is 400-600 s, and plasma discharge time of the high-temperature plasma oxidation is 600-1000 s.

Under the above conditions, the diameter, density, duration and excitation position of the plasma fireball may be effectively controlled to achieve the desired oxidation conditions. The inventors have found through repeated experiments that under the oxidizing conditions of the present disclosure, the chemical reaction rate of the plasma is much larger than the diffusion effect of carbon, and the resulting silicon oxide has excellent isotropic properties. Especially when fabricating a thick silicon oxide layer, the effect is more prominent.

Based on the above silicon carbide oxidation method, the present disclosure provides a manufacturing method of a grooved gate MOSFET device based on a two-step microwave plasma oxidation, comprising:

after a grooved gate etching, oxidizing silicon carbide on a surface of the grooved gate to silicon dioxide by microwave plasma to form a grooved gate oxide layer, the step of forming the grooved gate oxide layer comprising:

placing a silicon carbide substrate subjected to the grooved gate etching in a microwave plasma generating device;

introducing a first oxygen-containing gas, heating generated oxygen plasma to a first temperature at a first heating rate, and performing low-temperature plasma oxidation at the first temperature and a first pressure;

heating the oxygen plasma to a second temperature at a second heating rate, introducing a second oxygen-containing gas, and performing high-temperature plasma oxidation at the second temperature and a second pressure until a predetermined thickness of silicon dioxide is formed;

stopping introducing the oxygen-containing gas, and completing reaction;

wherein, the first temperature is 300-400° C., the second temperature is 700-900° C., the first pressure is 100-200 mTorr, the second pressure is 700-900 mTorr, the first heating rate is 1-1.5° C./s, and the second heating rate is 0.5-1° C./s.

In an embodiment of the present disclosure, the first oxygen-containing gas is a mixture of oxygen and hydrogen or an inert gas, wherein oxygen content is 30-99 vol. %, and the second oxygen-containing gas is pure oxygen.

The thickness of the oxide layer in the present disclosure may be flexibly adjusted. In some embodiments of the present disclosure, the thickness of the resulting silicon dioxide is 1-60 nm.

In an embodiment of the present disclosure, the method further comprises a step of discharging generated carbon monoxide.

In an embodiment of the present disclosure, after the completion of the reaction, nitrogen gas is introduced, and temperature is lowered in a nitrogen atmosphere.

Embodiment 1

Figure 4:
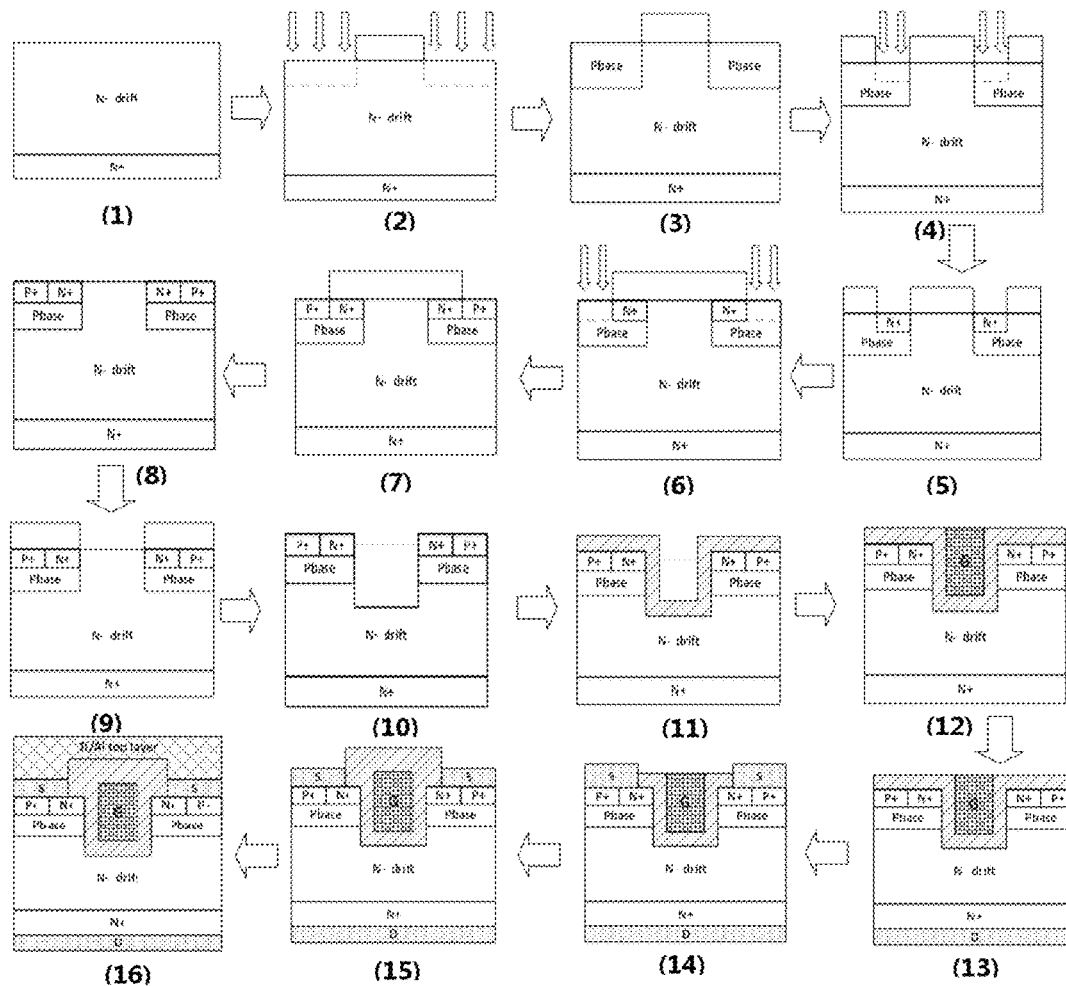
FIG. 4 is a flow chart of fabricating a grooved gate MOSFET device according to an embodiment of the present disclosure.

As shown in FIG. 4, the fabricating method of the grooved gate MOSFET device generally includes the following steps:
(1) Cleaning the substrate;
(2) Forming P-base implantation mask on the substrate and performing ion implantation;
(3) Forming N-plus mask and performing ion implantation;
(4) Forming P-base and removing the corresponding mask;
(5) Forming N-plus and removing the corresponding mask;
(6) Forming P-plus mask and performing ion implantation;
(7) High-temperature activation annealing;
(8) Forming P-plus and removing the corresponding mask;
(9) Forming grooved gate etching mask;
(10) Grooved gate etching;
(11) Forming grooved gate oxide layer;
(12) Making a polysilicon gate electrode;
(13) Making a source electrode;
(14) Making a drain electrode;
(15) Making interlayer media;
(16) Make a cover metal.

In the embodiment, when forming grooved gate oxide layer, the microwave plasma oxidation method is adopted, and the specific steps are as follows.

The microwave input power of the microwave plasma generating device is set to 1000 w, and the microwave frequency for exciting the microwave plasma is adjustable in a range of 2.4-2.5 GHz. In an environment where the gas pressure is 100 mTorr and H2:O2=1:1, the initial temperature of the stage on which the sample is set is set to 100° C., the plasma is heated at a rate of 1° C./s, and after reaching 350° C., low-temperature oxidation is performed with the plasma discharge time of 400 s. Then, the heating rate is changed to 0.5° C./s, and the temperature is raised to the preset microwave plasma oxidation temperature of 800° C. Then, the gas is changed to pure oxygen, the gas pressure is changed to 800 mTorr, high-temperature oxidation is performed with the plasma discharge time of 800 s, and the thickness of the oxide layer is about 30 nm. After the oxidation is completed, the pure oxygen is changed to pure nitrogen, and the temperature is lowered under a nitrogen atmosphere.

Figure 5:
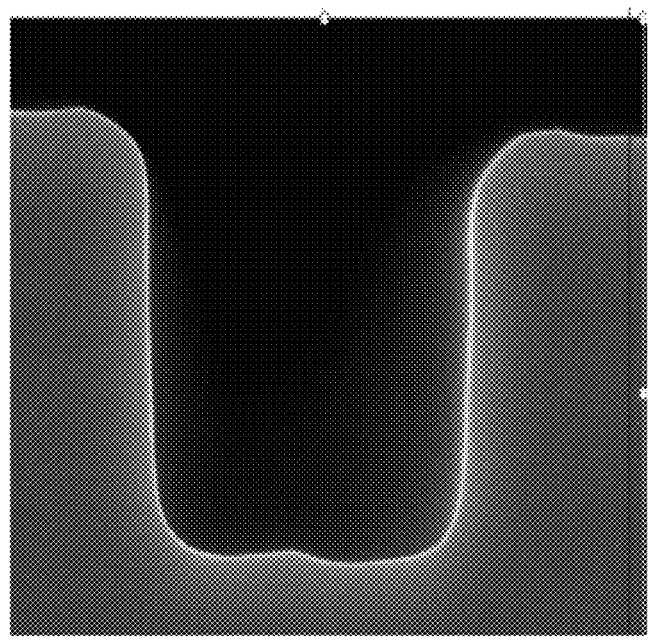
FIG. 5 is a SiC/$SiO_2$ interface according to an embodiment of the present disclosure.

It can be seen from FIG. 5 that the SiC/SiO$_2$ interface formed by the plasma oxidation process of the present disclosure has clear interface, low surface roughness, less damage of the oxide layer, flat surface, uniform oxidation rate of the sidewall and the bottom, and good isotropy.

Figure 6:
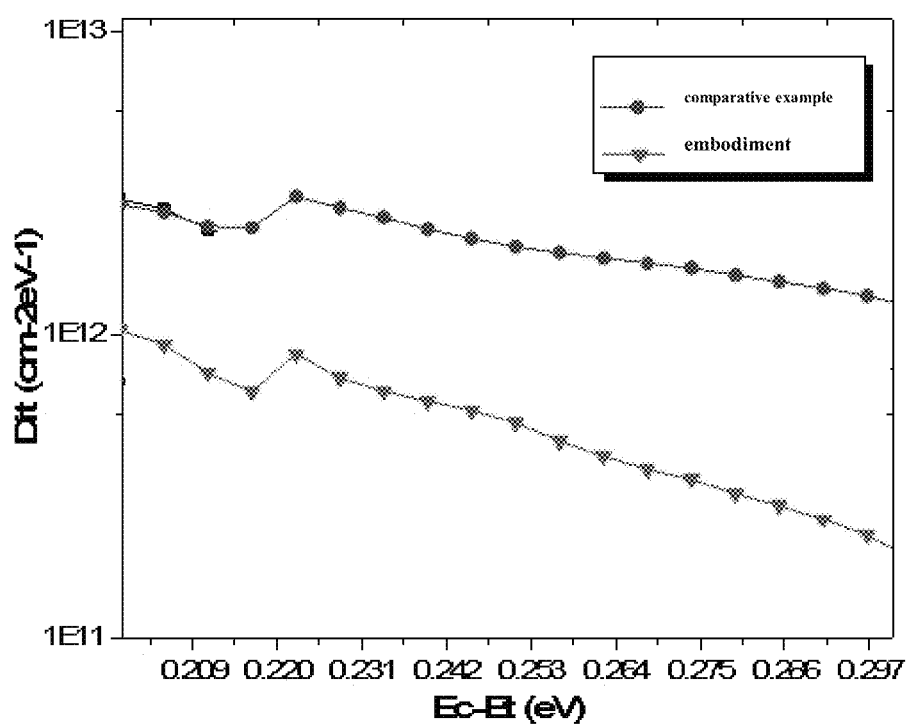
FIG. 6 is a graph comparing the interface state density in an embodiment of the present disclosure and that in a comparative example.

In the comparative example of the present disclosure, the silicon carbide substrate was placed in a high-temperature oxidation furnace and subjected to conventional high-temperature oxidation at 1200° C. As can be seen from FIG. 6, the interface state density obtained by the plasma oxidation process in the embodiment of the present disclosure was remarkably lower than conventional high-temperature oxidation.

Compared with the conventional high-temperature oxidation or low-temperature plasma oxidation method, the oxidation reaction efficiency of the present disclosure can be increased by 20%-50%, the C-related defects can be reduced by more than 20%, and the formation rate of the SiC surface corrosion pit can be reduced to less than 10%.

The specific embodiments described above further illustrate the purpose, technical solutions and beneficial effects of the present disclosure. It should be understood that the above description is only specific embodiments of the present disclosure and is not used to limit the present disclosure. Any modification, equivalent replacement, and improvement made within the spirit and principle of the present disclosure shall fall within the protection scope of the present disclosure.

What is claimed is:

1. A method for manufacturing a grooved MOSFET device based on a two-step microwave plasma oxidation, comprising:

etching a grooved gate, and oxidizing silicon carbide on a surface of the grooved gate to form silicon dioxide using microwave plasma to form a grooved gate oxide layer, the step of forming the grooved gate oxide layer comprising:

placing a silicon carbide substrate subjected to the grooved gate etching in a microwave plasma generating device;

introducing a first oxygen-containing gas, heating generated oxygen plasma to a first temperature at a first heating rate, and performing low-temperature plasma oxidation at the first temperature and a first pressure;

heating the oxygen plasma to a second temperature at a second heating rate, introducing a second oxygen-containing gas, and performing high-temperature plasma oxidation at the second temperature and a second pressure until a predetermined thickness of silicon dioxide is formed;

stopping introducing the oxygen-containing gas, and completing reaction;

wherein, the first temperature is 300-400° C., the second temperature is 700-900° C., the first pressure is 100-200 mTorr, the second pressure is 700-900 mTorr, and the first heating rate is greater than the second heating rate.

2. The method according to claim 1, wherein the first heating rate is 1-1.5° C./s, and the second heating rate is 0.5-1° C./s.

3. The method according to claim 1, wherein the microwave plasma generating device has an input power of 800-2000 W and a microwave frequency of 2.4-2.5 GHz.

4. The method according to claim 1, wherein plasma discharge time of the low-temperature plasma oxidation is 400-600 s, and plasma discharge time of the high-temperature plasma oxidation is 600-1000 s.

5. The method according to claim 1, wherein the first oxygen-containing gas is a mixture of oxygen and hydrogen or an inert gas, wherein oxygen content is 30-99 vol. %, and the second oxygen-containing gas is pure oxygen.

6. The method according to claim 1, wherein the formed silicon dioxide has a thickness of 1-60 nm.

7. The method according to claim 1, wherein the method further comprises a step of discharging generated carbon monoxide.

8. The method according to claim 1, wherein after the completion of the reaction, nitrogen gas is introduced, and temperature is lowered in a nitrogen atmosphere.

* * * * *